US005768289A

United States Patent [19]

James

[11] Patent Number: 5,768,289
[45] Date of Patent: Jun. 16, 1998

[54] DYNAMICALLY CONTROLLING THE NUMBER OF BOUNDARY-SCAN CELLS IN A BOUNDARY-SCAN PATH

[75] Inventor: David B. James, Sacramento, Calif.

[73] Assignee: Intel Corporation, Santa Clara, Calif.

[21] Appl. No.: 862,006

[22] Filed: May 22, 1997

[51] Int. Cl.⁶ .................................................. G06F 11/00
[52] U.S. Cl. .................................................. 371/22.32
[58] Field of Search ........................... 371/22.32, 22.1, 371/22.34, 22.5, 22.6; 395/183.06

[56] References Cited

PUBLICATIONS

"Boundary–Scan Architecture and IEEE Std 1149.1", Texas Instruments, pp. 3–1 through 3–15, 1990.
"Boundary–Scan Test, A Practical Approach", Bleeker, et al., Kluwer Academic Publishers, pp. 1–84.
"IEEE Standard Test Access Port and Boundary–Scan Architecture", IEEE Std. 1149.1–1990 (includes IEEE std 1149.1a–1993, pp. iii–XV and XVii, 1–1 through A–12, 1990.

"Introduction To On–Board Programming with Intel Flash Memory", pp. 1–9, Peter T. Larsen, Intel ® Application Note AP–624 Mar. 1996.

"Simplify Manufacturing By Using Automatic–Test–Equipment For On–Board Programming", Peter T. Larsen, pp. 1–15, Intel ® Application Note AP–629, Jun. 1996.

"Designing For On–Board Programming Using The IEEE 1149.1 (JTAG) Access Port", pp. 1–15, Peter T. Larsen, Intel ® Application Note AP–630, Aug. 1996.

Primary Examiner—Vincent P. Canney
Attorney, Agent, or Firm—Blakely, Sokoloff, Taylor & Zafman

[57] ABSTRACT

A method and apparatus for dynamically configuring the number of boundary-scan cells in a boundary-scan path is disclosed. A plurality of control signals is asserted to a plurality of boundary-scan cells in a boundary-scan path. Each control signal of the plurality of control signals is in a first state or a second state. For each control signal that is in a first state, a respective one of the plurality of boundary-scan cells is bypassed in the boundary-scan path.

20 Claims, 11 Drawing Sheets

DYNAMICALLY CONTROLLING THE NUMBER OF BOUNDARY-SCAN CELLS IN A BOUNDARY-SCAN PATH

FIELD OF THE INVENTION

The present invention relates to the field of digital signal generation. More particularly, this invention relates to a method and apparatus for generating test and programming signals on a printed circuit board.

BACKGROUND OF THE INVENTION

During the early 1980's, as semiconductor device packages continued to shrink and pin count continued to grow, board-level and device-level testing using traditional techniques became increasingly difficult. Then, in 1985, a group of consumer electronics and semiconductor manufacturers formed the Joint Test Access Group (JTAG) to develop a standard for incorporating testability features into semiconductor devices. The standard was adopted in February, 1990 as IEEE Std. 1149.1-1990, IEEE Standard Test Access Port and Boundary Scan Architecture. IEEE 1149.1 is based on the fact that the majority of circuit board failures are caused by faulty connections at the boundary between the core logic of an integrated circuit and circuit board traces. These include bad solder joints, bad wire bond connections, missing devices, incorrect device orientations, connector faults and others.

IEEE 1149.1 specifies that for each input/output (I/O) pin of an integrated circuit (IC) device, at least one observe-and-control element known as a boundary-scan cell is to be interposed between the IC core logic and the I/O pin. In normal operation of the IC device, the boundary-scan cells of the device allow signals to be transparently passed between their respective I/O pins and the IC core logic. However, when the IC device is placed in a boundary-test mode, storage elements within the boundary-scan cells can be used to generate and receive signals at the I/O pins.

As it turns out, the ability to generate signals at the IC boundary independently of the IC core logic is tremendously useful. Not only can the boundary connections of the IC device be tested, but signals can also be generated to control the operation of neighboring devices. One particularly useful application of boundary signal generation, for example, is on-board programming of non-volatile memories such as flash memory.

Typically when a program like a boot program for a consumer electronics device is to be stored in a non-volatile memory device, the boot program is either written to the non-volatile memory device before the device is installed on the circuit board, or bed-of-nails style automated test equipment (ATE) is used to program the device after it has been installed on the circuit board. Both approaches have disadvantages. First, when the non-volatile memory device is to be programmed before being installed in-circuit, additional handling of the device is required, increasing the likelihood of device failure. Also, unless the device can be easily removed from the circuit board, the ability to make last minute code updates or field upgrades after the device has been installed in-circuit is severely limited.

The problems of additional device handling and limited code upgradability can be avoided by using ATE, but ATE is also considerably more expensive than a typical device programmer. Also, in space-constrained environments or high-speed designs, it is not always possible to incorporate the test land pads required to link the printed circuit board to an ATE bed-of-nails interface.

Because of the above-described disadvantages of conventional device programming techniques and because of the continuing miniaturization of electronics components, using boundary-scan to perform on-board programming is becoming increasingly popular. One disadvantage of using boundary-scan to perform on-board programming, however, is that it can be time-consuming, particularly when their are a large number of boundary-scan cells in the boundary-scan path. To appreciate why this is so, it is helpful to examine the architecture and operation of prior-art boundary-scan devices.

Figure 1:
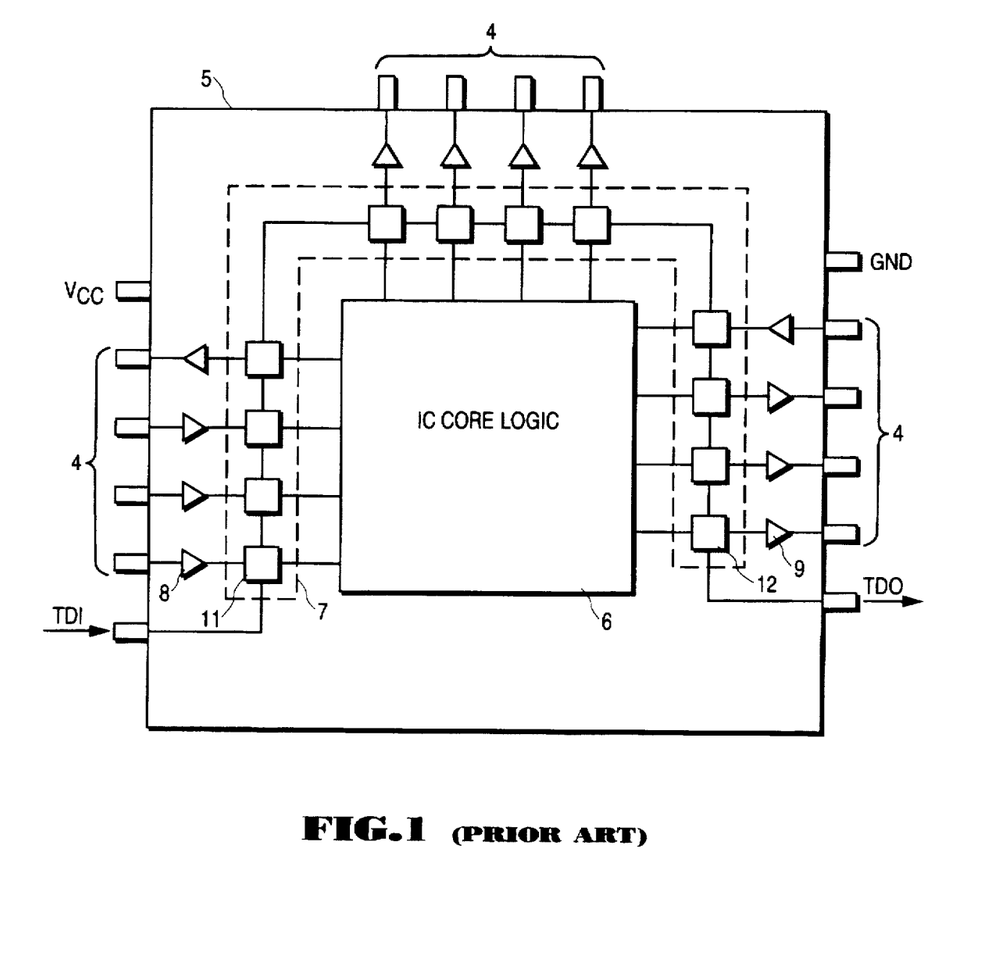
FIG. 1 is a diagram of a prior-art IC device including boundary-scan cells interposed between the device I/O pins and core logic.

FIG. 1 depicts a prior-art IC device 5 including boundary-scan cells interposed between the device I/O pins 4 and core logic 6. Note that certain pins such as Vcc and GND are not I/O pins and therefore do not have corresponding boundary-scan cells. Each boundary-scan cell has a normal data input (NDI), normal data output (NDO), serial data input and serial data output. For a boundary-scan cell 11 connected to a device input pin, the NDI is coupled to the I/O pin via input buffer 8 and the NDO is connected to IC core logic 6. For a boundary-scan cell 12 connected to a device output pin, the NDI and NDO connections are reversed; the NDI is coupled to IC core logic 6 and the NDO is coupled to the I/O pin via output buffer 9.

The serial data output of each boundary-scan cell is coupled to the serial data input of a succeeding boundary-scan cell to form a shift register called a "boundary-scan register" 7. Data shifted into the boundary-scan register 7 via a test data input pin (TDI) can be asserted at output pins of the IC device, and data captured at input pins of the IC device can be shifted out a test data output pin (TDO) of the IC device for examination. Also, by daisy-chaining the TDI and TDO pins of multiple devices on a circuit board, it becomes possible to shift serial test data through each of the interconnected IC devices using a single TDI/TDO pair. The serial data path through a given set of boundary-scan cells is referred to as a boundary-scan path.

Figure 2:
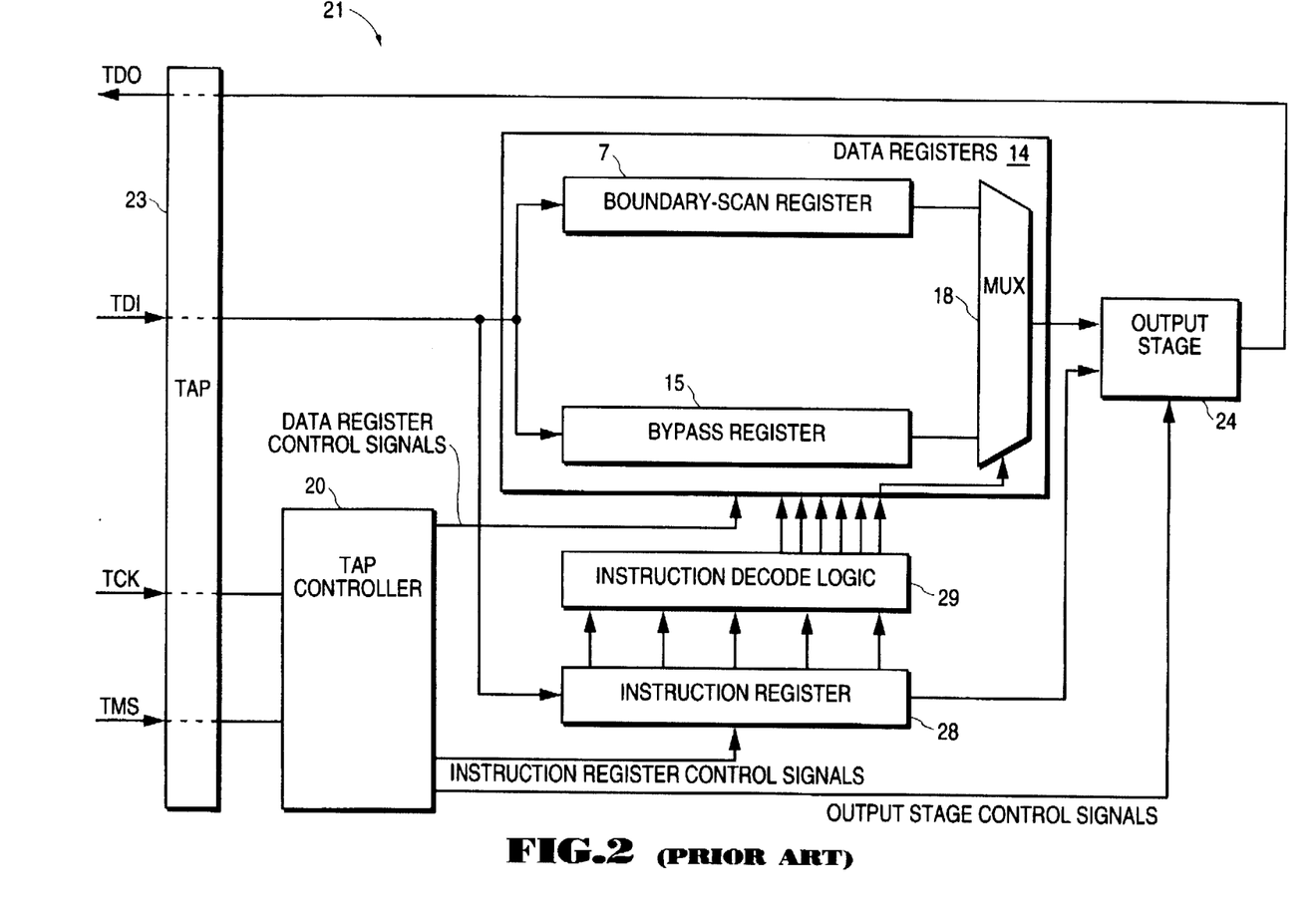
FIG. 2 is an architecture diagram of a prior-art device.

FIG. 2 depicts a prior-art IEEE 1149.1-compliant device architecture referred to as a "boundary-scan architecture" 21. Boundary-scan architecture 21 includes a Test Access Port (TAP) 23, TAP controller 20, instruction register 28, instruction decode logic 29, data register bank 14 and an output stage 24. Although instruction decode logic 29 is shown as being separate from instruction register 28, instruction decode logic 29 may also be considered to be part of instruction register 28. Data register bank 14 includes the boundary-scan register 7, described above, and a bypass register 15. Bypass register 15 is a single shift element not associated with the IC core logic or I/O pins. Its purpose is to provide an alternate serial data path between the TDI and TDO pins of a JTAG-compliant device. As described below, only one of the registers in data register bank 14 forms the serial data path between TDI and TDO at any given time.

The TAP 23 is the interface between the boundary-scan architecture 21 and the four IC device pins required by IEEE 1149.1: test data in (TDI) and test data out (TDO), described above, test clock (TCK) and test mode select (TMS).

The TAP controller 20 is a sixteen-state state machine driven by TCK and TMS signals asserted at the respective TCK and TMS pins of the IC device. The TAP controller 20 transitions from an existing state to one of two possible states at each rising edge of the TCK signal based on the level of the TMS signal. Of the sixteen TAP controller states, one state is used to reset the test logic, and another state is an idle state from which either an instruction register scan or a data register scan can be selected. Of the remaining fourteen states, seven are used to perform a data register scan and seven are used to perform an instruction register scan.

Instruction register scan and data register scan are symmetrical operations consisting of cycling the TAP controller 20 through a sequence of states to perform sample, shift and transfer operations within the indicated register. In the case of an instruction register scan, the TAP controller 20 enters a capture-IR state in which it issues instruction register control signals to cause the instruction register to sample device status information. Then, in a shift-IR state, the device status information is shifted out of the instruction register via the TDO pin while a sequence of bits representing a new instruction is concurrently shifted into the instruction register via the TDI pin. After the new instruction has been shifted into the instruction register, it is transferred to a bank of output elements included in instruction register 28 during an update-IR state of the TAP controller 20.

The instruction transferred to the bank of output elements in instruction register 28 is decoded by instruction decode logic 29 to select one of the registers in data register bank 14 to form the serial data path between TDI and TDO pins of the IC device. This is shown, at least as to the data register output, by multiplexer 18 which is controlled by a signal from instruction decode logic 29 to pass the output of either the boundary-scan register 7 or the bypass register 15 to output stage 24. As discussed below, the instruction in instruction register 28 is also decoded by instruction decode logic 29 to select the source of data shifted into a boundary-scan cell and to select the source of data asserted at the NDO of a boundary-scan cell.

When TAP controller 20 is sequenced through a data register scan, TAP controller 20 issues data register control signals to each of the data registers included in data register bank 14. As discussed above, only one of the data registers from data register bank 14 is selected to form the serial data path between TDO and TDI at any given time, and a non-selected register is not disturbed during the data register scan. When the bypass register is 15 the selected data register, the serial data path of the device is reduced to a single storage element, and data shifted through the bypass register 15 does interfere with the normal operation of the IC.

When the boundary-scan register 7 is the data register selected to form the serial data path between the TDI and TDO pins of the IC device, sample, shift and update operations similar to those performed in the instruction register 28 can be performed. First, in a capture-DR state, the TAP controller 20 outputs data register control signals to cause each boundary-scan cell in the boundary-scan register 7 to sample its respective NDI. Then, in a shift-DR state, the TAP controller 20 outputs data register control signals to shift a sequence of bits into the boundary-scan cells of the boundary-scan register 7 via the TDI while concurrently shifting the values sampled during the capture-DR state out of the boundary-scan register 7 via the TDO. Finally, during an update-DR state, the TAP controller 20 outputs a signal to cause the sequence of bits shifted into the boundary-scan cells to be transferred to a bank of output elements within the boundary-scan register 7.

To comply with IEEE 1149.1, boundary-scan architecture 21 must be capable of carrying out three instructions: BYPASS, SAMPLE/PRELOAD and EXTEST. The BYPASS instruction is used to select the bypass register 15 to form the serial data path between TDI and TDO. The SAMPLE/PRELOAD instruction is used to select the boundary-scan register 7 to form the serial data path between TDI and TDO, and to permit the NDI of each boundary-scan cell to be sampled without interfering with the normal operation of the IC. The SAMPLE/PRELOAD instruction further permits the boundary-scan register 7 to be loaded with a sequence of bits to be later output at the NDO of respective boundary-scan cells. This operation is called a "preload".

The EXTEST instruction also selects the boundary-scan register 7 to form the serial data path between TDI and TDO. However, during EXTEST, the NDO of each boundary-scan cell coupled to an output pin is isolated from the NDI (the IC core logic), and is instead driven by a bit stored in a respective one of the output elements during the update-DR state of the TAP controller. Thus, after an EXTEST instruction has been shifted into instruction register 28, sequences of bits may be shifted into the boundary-scan register 7 one after the other and output at respective NDOs. As stated above, this permits a number of different tests to be performed and also makes on-board programming possible.

Figure 3:
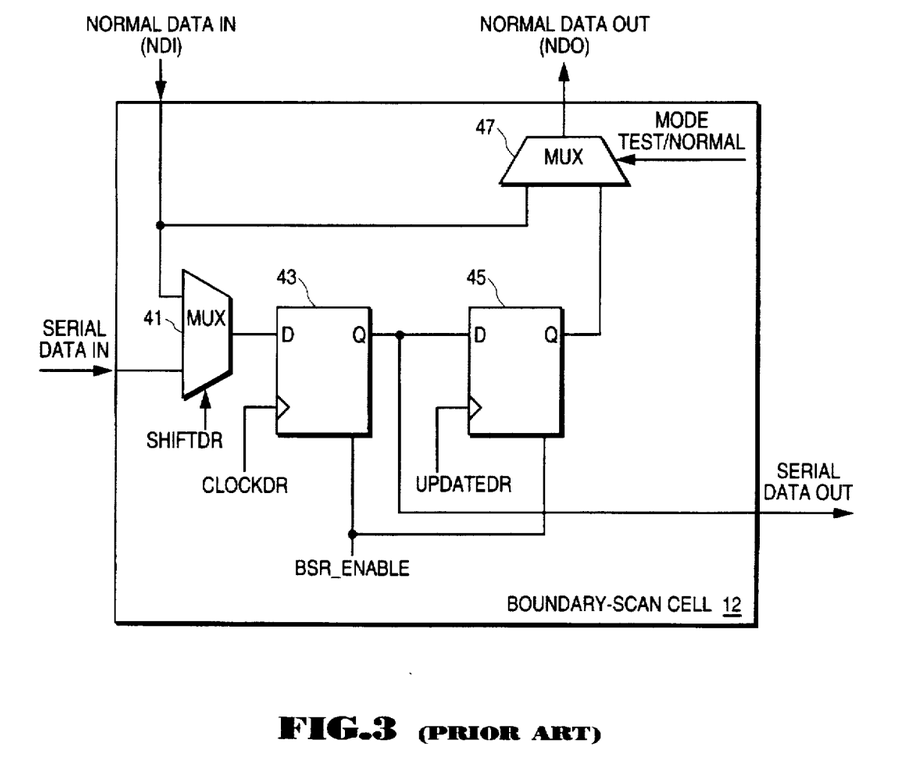
FIG. 3 is a circuit diagram of a prior-art boundary-scan cell.

FIG. 3 is a circuit diagram of a prior-art boundary-scan cell 12 that can be used to support either an input or output pin of a JTAG-compliant device. Not all boundary-scan cells need include every element shown in boundary-scan cell 12. For example, an input pin may be supported in compliance with IEEE 1149.1 by a boundary-scan cell that does not include storage element 45 or multiplexer 47, and for which the NDI is coupled directly to the NDO.

Contents of the instruction register (element 28 of FIG. 2) are decoded to generate the BSR_ENABLE and MODE signals shown in FIG. 3. When the instruction register contains a BYPASS instruction, the BSR_ENABLE signal is deactivated to disable storage elements 43 and 45 from receiving input data, and the MODE signal selects the NDI to be coupled to the NDO through multiplexer 47. In this state, the boundary-scan cell 12 does not interfere with the normal signal flow from NDI to NDO and the boundary-scan cell 12 is prevented from shifting data from the serial data input to the serial data output.

When the instruction register contains a SAMPLE/PRELOAD instruction, the BSR_ENABLE signal is activated to enable storage elements 43 and 45 to receive input data in response to transitioning signals at their respective clock inputs. The MODE signal continues to select the NDI to be coupled to the NDO through multiplexer 47 so that the boundary-scan cell 12 does not interfere with the normal operation of the IC. When the TAP controller enters the capture-DR state discussed above, the SHIFTDR signal selects the NDI to be asserted at the input of storage element 43 via multiplexer 41 and the CLOCKDR signal is pulsed to shift a bit representing a sample of the NDI into storage element 43. When the TAP controller (element 20 of FIG. 2) subsequently enters a shift-DR state, the SHIFTDR signal selects the serial data input to be asserted at the input of storage element 43 via multiplexer 41, and the CLOCKDR signal is pulsed again to shift the serial data input into storage element 43.

Herein, storage element 43 is referred to as a "shift element" to distinguish it from storage element 45, which is called an "output element". As shown in FIG. 3, the output of shift element 43 is asserted at the serial data output so that the respective shift elements of the boundary-scan cells within a boundary-scan register (element 7 of FIG. 2) form the serial data path of the boundary-scan register. Because of this structure, iterative entry to the shift-DR state of the TAP controller causes data to be shifted from boundary-scan cell to boundary-scan cell until it is finally asserted at the TDO. This way, each of the NDI values sampled during the capture-DR state of the TAP controller is eventually output at the TDO. Also, since the serial data input of the first boundary-scan cell of the boundary-scan register is coupled to the TDI, a sequence of bits asserted at the TDI can be shifted into the respective shift elements of the boundary-scan cells in the boundary-scan register. Finally, when the TAP controller enters the update-DR state, the UPDATEDR signal is pulsed to latch the output of shift element 43 in output element 45.

After an EXTEST instruction has been received in the instruction register, the BSR_ENABLE signal remains active, but the MODE signal is changed to isolate the NDI from the NDO and to select output element 45 to drive the NDO. Thus, the EXTEST instruction allows the sequence of bits preloaded in the respective output elements 45 of boundary-scan cells to be asserted at output pins of the IC device. The capture-DR, shift-DR and update-DR states described above can be repeated while an EXTEST instruction is pending to output a subsequent set of signals without having to repeat the preload operation. Moreover, since output pins of one device in the TDI/TDO chain of JTAG-compliant device may be coupled to input pins of another JTAG-compliant device in the chain, the capture-DR state of the TAP controller allows a test value output during EXTEST to be sampled at the NDI of the other JTAG-compliant device and subsequently shifted out the TDO of the last JTAG-compliant device in the TDI/TDO chain.

As discussed above, on-board programming can be performed by shifting sequences of bits into the boundary-scan register that match the desired sequences of address, data and control signals and successively outputting those signals. This would typically be accomplished by shifting in a sequence of bits matching an initial output pattern using the SAMPLE/PRELOAD instruction, then asserting the initial output signal pattern at the address, control and data pins in response to an EXTEST instruction. Thereafter, repeated data register scan operations can be used to shift in sequences of bits to drive the address, data and control pins to program the target device.

One problem with using the boundary-scan register of a JTAG-compliant device to perform on-board programming is that the boundary-scan path often includes a large number of boundary-scan cells that are not involved in the programming operation. Thus if numerous JTAG-compliant devices are present in the boundary-scan path, the number of boundary-scan cells in the boundary-scan path may number in the hundreds or even thousands. Of course, the number of boundary-scan cells in the boundary-scan path can be reduced by selecting the bypass register to be the data register for all JTAG-compliant devices in the boundary-scan path not having pins involved in on-board programming. However, even one JTAG-compliant device such as a microprocessor may have significantly more I/O pins than must be controlled to perform on-board programming operations. For example, an Intel™ Pentium™ processor may have over two-hundred I/O pins, only forty or so of which must be controlled to perform on-board programming. In that case, each new pattern of signals that is asserted requires over two-hundred bits of data to be shifted into the boundary-scan register. Moreover, in the case of a flash memory device, four or more shift operations may be necessary to program each word or byte. Thus, despite its advantages, using boundary-scan to perform on-board programming can be unacceptably slow, particularly in a manufacturing environment where programming throughput is critical.

BRIEF SUMMARY OF THE INVENTION

A method and apparatus for dynamically controlling the number of boundary-scan cells in a boundary-scan path is described. A plurality of control signals is asserted to a plurality of boundary-scan cells in a boundary-scan path. Each control signal is in a first state or a second state. Each one of the plurality of boundary-scan cells that receives a control signal that is in a first state is bypassed in the boundary-scan path.

BRIEF DESCRIPTION OF THE DRAWING

The present invention is illustrated by way of example and not limitation in the figures of the accompanying drawing in which like references indicate similar elements and in which.

DETAILED DESCRIPTION

An apparatus for controlling the number of boundary-scan cells in a boundary-scan path according to one embodiment of the present invention includes a boundary-control register having a plurality of boundary-control cells to generate boundary-control signals to respective boundary-scan cells in a boundary-scan register. Each boundary-scan cell of the boundary-scan register is modified to include a bypass circuit coupled between the serial data input and serial data output of the cell. The bypass circuit is configured to bypass the boundary-scan cell in the boundary-scan path by forming a signal path between the serial data input of the cell and the serial data output of the cell in response to an active boundary-control signal from the boundary-control cell. The apparatus further includes modified instruction decode logic to support a special instruction code called PATHDEF.

When the PATHDEF instruction is loaded into the instruction register of a device according to one embodiment of the present invention, the boundary-control register is selected to form the serial data path between the TDI/TDO pins of the device. A sequence of control bits is then shifted into the boundary-control register during shift-DR states of a TAP controller, each control bit ultimately being stored in a shift element of a respective boundary-control cell. Then, during the update-DR state of the TAP controller, the control bits stored in the shift elements of the boundary-control cells are transferred to respective output elements of the boundary-control cells. If the control bit within a given output element is in a first state, an active boundary-control signal is asserted to the bypass circuit within the corresponding boundary-scan cell to bypass the boundary-scan cell in the boundary-scan path. If the control bit within the output element is in a second state, an inactive boundary-control signal is asserted to the bypass circuit within the corresponding boundary-scan cell. In response to the inactive boundary-control signal the bypass circuit opens the signal path between serial data input and serial data output, and forms a signal path between the output of the boundary-scan cell shift element and the serial data output. Thus, based on the sequence of bits shifted into the boundary-scan register and then used to control the state of the plurality of boundary-control signals, any number of boundary-scan cells may be bypassed in the boundary-scan path of the JTAG-compliant device. In the context of on-board programming, all boundary-scan cells associated with I/O pins not necessary for programming a target device can be bypassed to substantially reduce the length of the boundary-scan path. In the case of some devices, this technique can render a five-fold reduction in the time required to program a target device.

Figure 4:
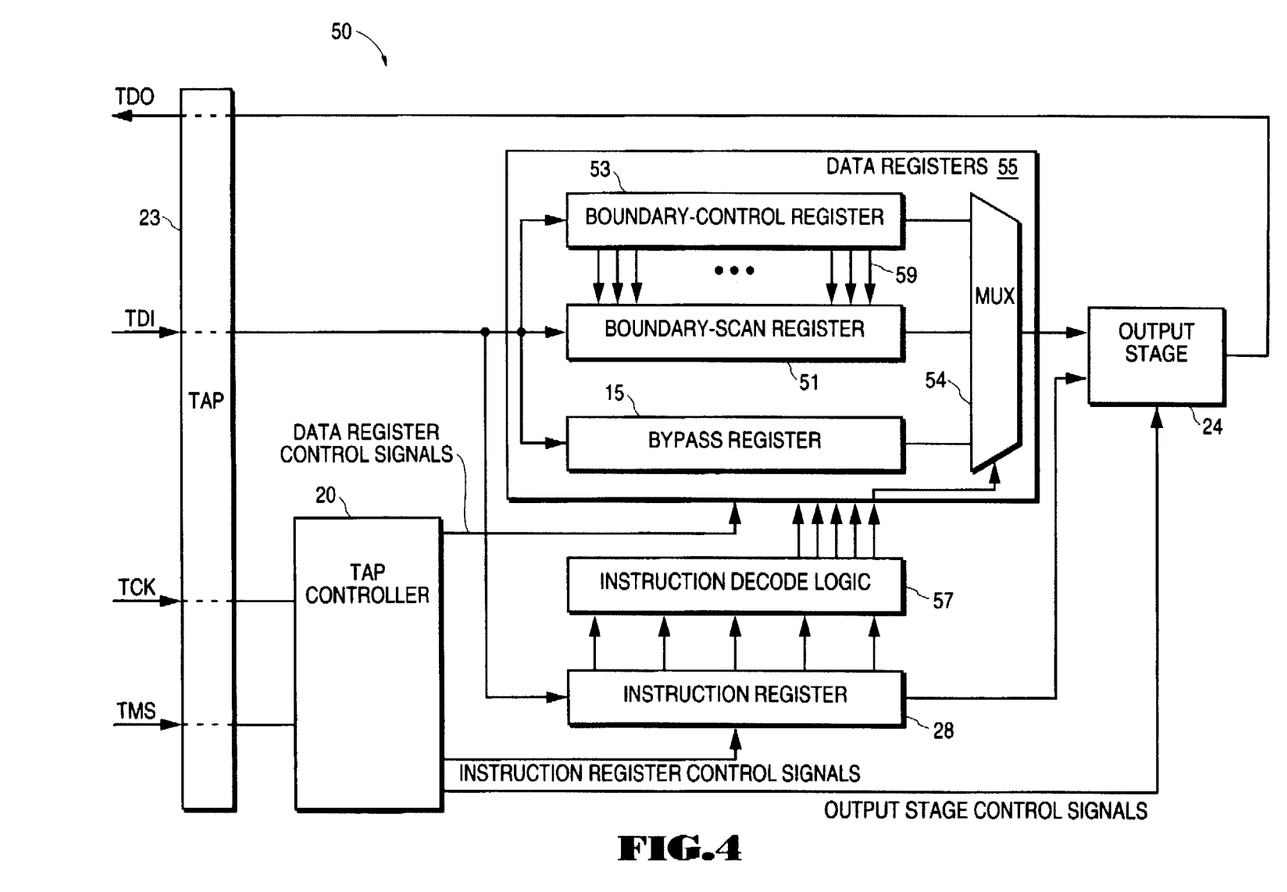
FIG. 4 is a diagram of a boundary-scan architecture according to one embodiment of the present invention.

FIG. 4 is a diagram of a boundary-scan architecture 50 according to one embodiment of the present invention. The TAP 23, TAP controller 20, instruction register 28, bypass register 15 and output stage 24 are as described above. The data register control signals, instruction register control signals and output stage control signals asserted by the TAP controller are also as described above.

Data register bank 55 has been modified to include boundary-control register 53 and modified boundary-scan register 51. Also, multiplexer 54 is modified to the extent necessary to allow the output of either the boundary-control register 53, boundary-scan register 51 or bypass register 15 to be passed to the output stage 24. Instruction decode logic 57 is modified to support the PATHDEF instruction discussed above. When the PATHDEF instruction is entered into the instruction register in an instruction register scan, the boundary-control register is selected to be the data register coupled between TDI and TDO. This includes selecting the boundary-control register output to be passed through multiplexer 54 to output stage 24. As shown in FIG. 4, a plurality of boundary-control signals 59 are asserted from boundary-control cells within the boundary-control register to respective boundary-scan cells within the boundary-scan register 51.

Figure 5:
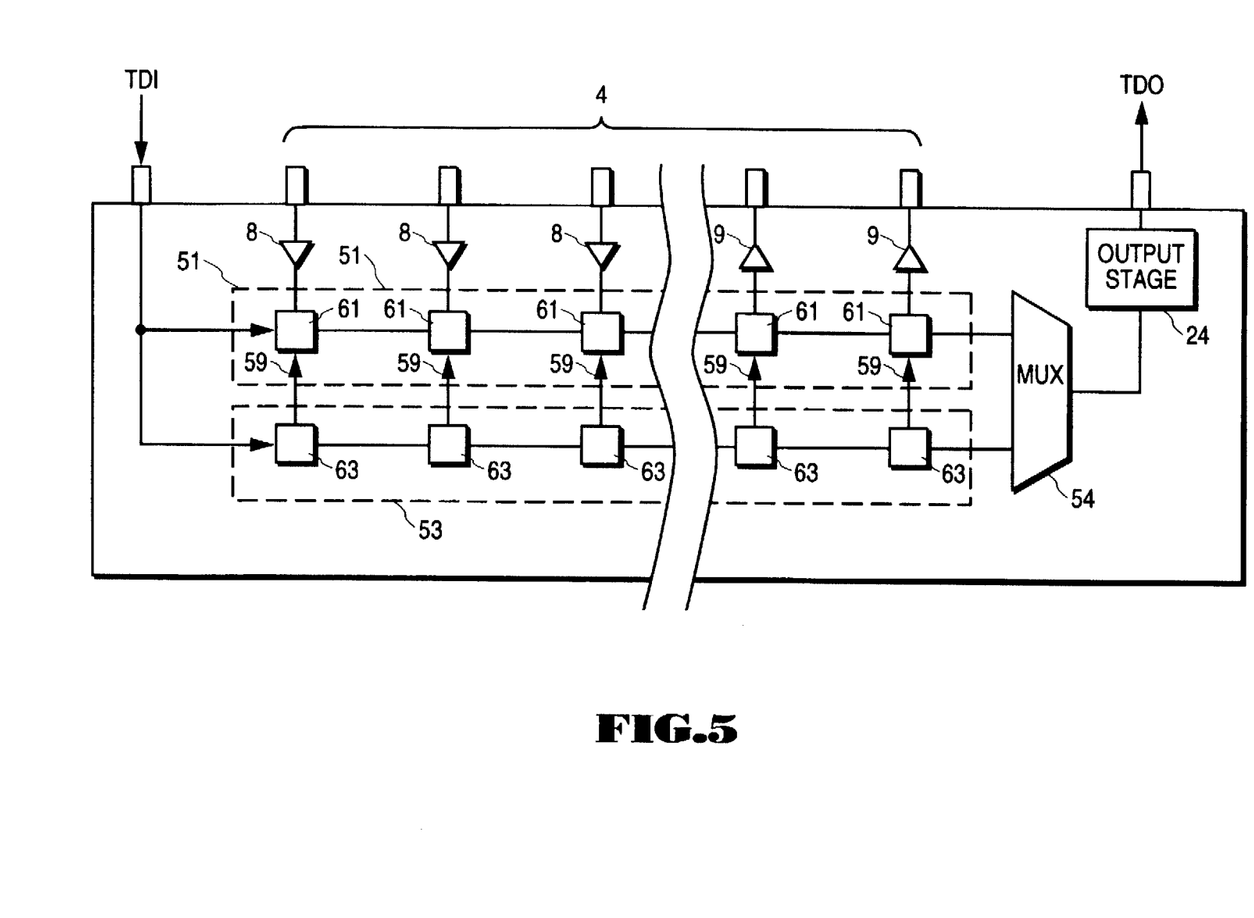
FIG. 5 is a diagram illustrating the relationship between boundary-control cells of a boundary-control register and boundary-scan cells of a boundary-scan register according to one embodiment of the present invention.

FIG. 5 illustrates the relationship between the boundary-scan cells of boundary-scan register 51 and the boundary-control cells of the boundary-control register 53. Though not shown, bypass register 15 is also coupled between TDI and multiplexer 54 of FIG. 5. Boundary-scan register includes modified boundary-scan cells 61, each coupled to a respective I/O pin 4 via an input buffer 8 or an output buffer 9. The connection between the modified boundary-scan cells 61 and the IC core logic is not shown.

According to one embodiment of the present invention, boundary-control register 53 includes one boundary-control cell 63 for each boundary-scan cell 61 in boundary-scan register 51. As shown, each boundary-control cell 63 outputs a boundary-control signal 59 to an associated boundary-scan cell within the boundary-scan register.

Figure 6:
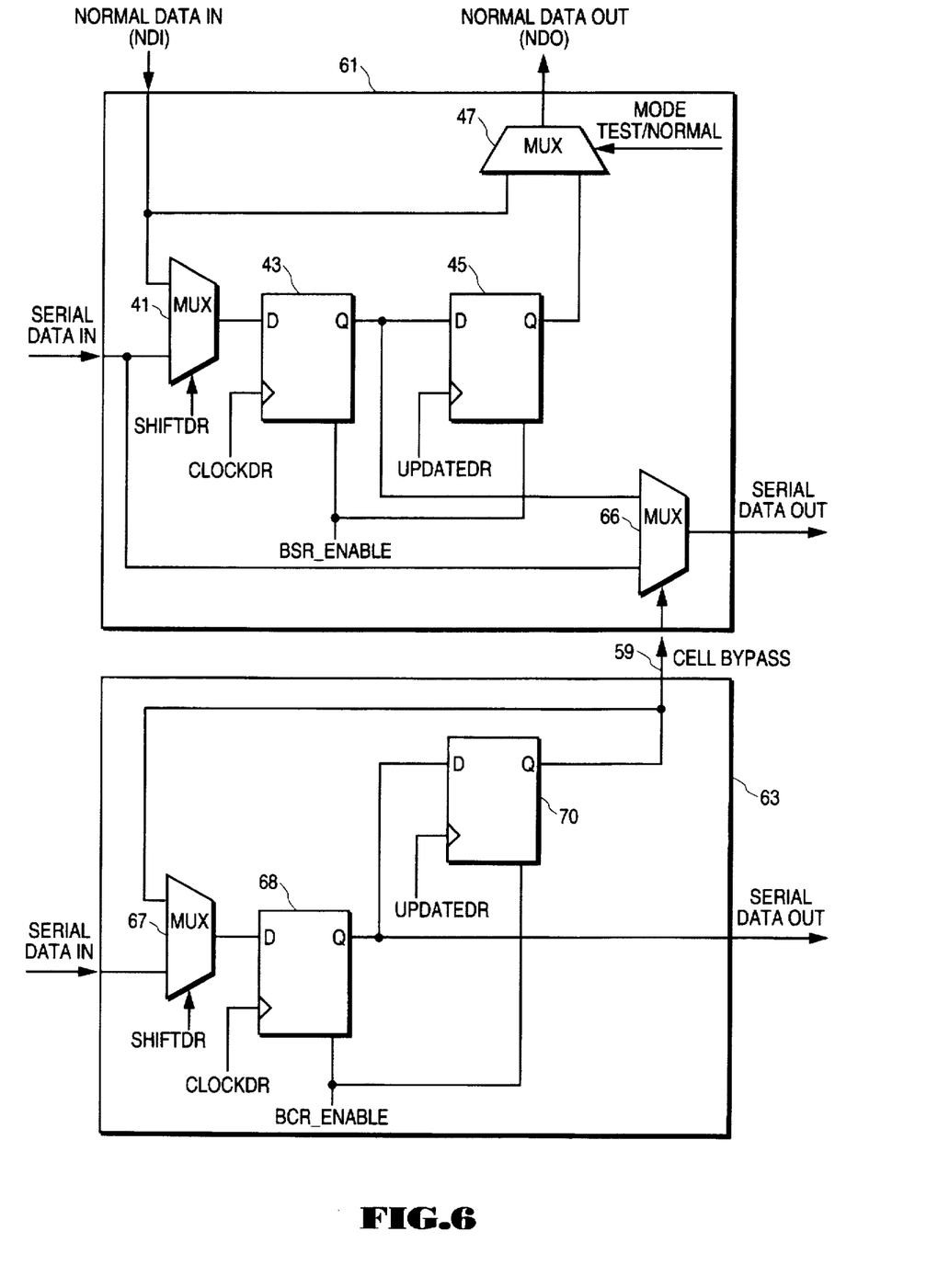
FIG. 6 is a circuit diagram of a modified boundary-scan cell and a boundary-control cell according to one embodiment of the present invention.

FIG. 6 is a circuit diagram of a modified boundary-scan cell 61 and a boundary-control cell 63 according to one embodiment of the present invention. Multiplexer 41, shift element 43, output element 45 and multiplexer 47 serve the purpose described above in reference to FIG. 3. However, instead of coupling the output of shift element 43 directly to the serial data output of boundary-scan cell 61, the output of shift element 43 is coupled to an input of multiplexer 66. The other input of multiplexer 66 is coupled to the serial data input and the output of multiplexer 66 is coupled to the serial data output. Thus, multiplexer 66 constitutes a bypass circuit controlled by cell bypass signal 59. When cell bypass signal 59 is activated, multiplexer 66 forms a signal path between the serial data input and the serial data output to bypass boundary-scan cell 61 from a boundary-scan path. Though not shown, the cell bypass signal may also be used to gate the BSR_ENABLE signal to prevent the contents of the shift element 43 and output element 45 from changing in a subsequent boundary-scan operation. Alternatively, CLOCKDR or UPDATEDR (or both) may be gated by the cell bypass signal 59 to prevent the contents of the shift element 43 or the output element 45, respectively, from changing.

In one embodiment of the present invention, boundary-control cell 63 includes multiplexer 67, shift element 68 and output element 70. After the PATHDEF instruction has been shifted into the instruction register 28 it is decoded by instruction decode logic (element 57 of FIG. 4) to assert the BCR_ENABLE signal. This enables the shift elements 68 of respective boundary-control cells to form a shift register between TDI and TDO. In a subsequent data register scan operation, the TAP-controller (element 20 of FIG. 4) sequences through capture-DR, shift-DR and update-DR states. During the shift-DR state, the TAP-controller sets signal SHIFTDR to select the cell bypass signal 59 to be passed through multiplexer 67 to the input of shift element 68. The TAP-controller also pulses the CLOCKDR signal during the capture-DR state so that shift element 68 samples the state of the cell bypass signal.

The TAP-controller then enters a shift-DR state, setting SHIFTDR to select the serial data input to be passed to the input of shift element 68 and pulsing CLOCKDR to shift the serial data input into shift element 68. By iteratively entering the SHIFTDR state, each of the cell bypass signals sampled in the capture-DR state is shifted out the TDO pin of the device and a sequence of control bits representing a new set of cell bypass signals is shifted into the boundary-control register, with each control bit of the sequence of control bits ultimately being shifted into a shift element 68 of a respective boundary-control cell. The TAP controller then transitions to the update-DR state to pulse the UPDATEDR signal. In response, the control bit stored in shift element 68 is shifted into output element 70 where it is used to determine the state of cell bypass signal 59.

While not shown in FIG. 5 or FIG. 6, it will be appreciated that the serial data input to boundary-control cell 63 and the serial data input to boundary-scan cell 61 may be coupled together. Because the shift element 68 of the boundary-control cell 63 are disabled when the shift element 43 is enabled, and vice-versa, only one of the boundary-control register and the boundary-scan register is enabled to form the serial data path between TDI and TDO at any given time.

Figure 7:
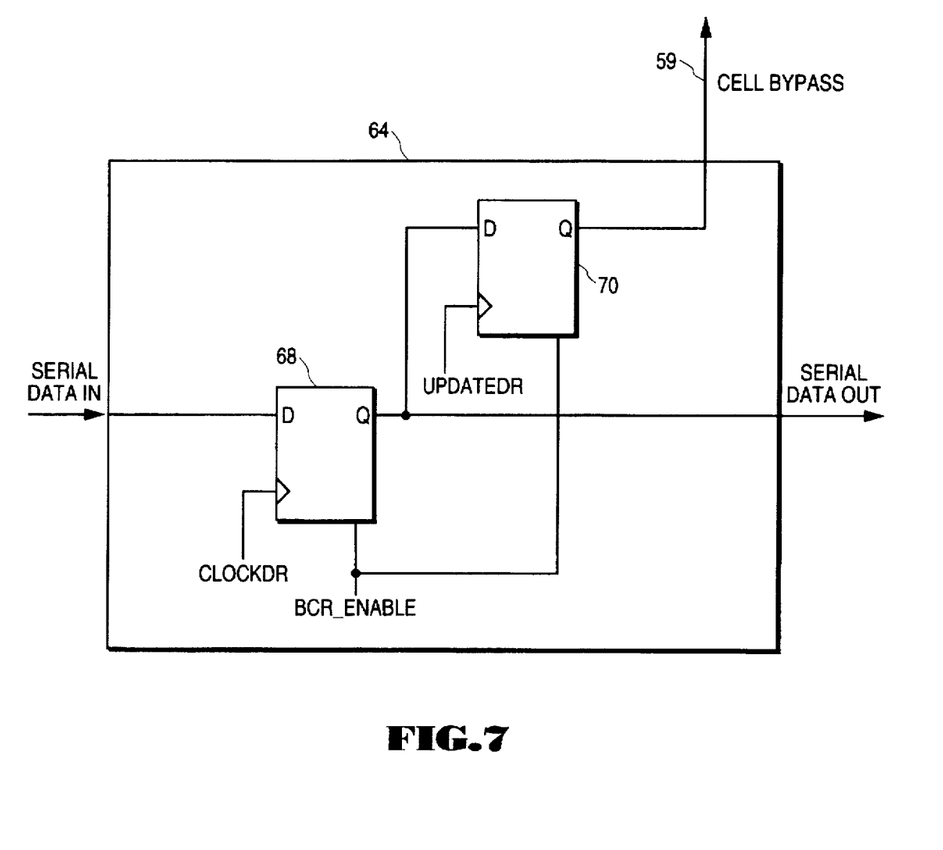
FIG. 7 is a circuit diagram of a boundary-control cell according to an alternate embodiment of the present invention.

FIG. 7 depicts an alternative embodiment of a boundary-control cell that does not include multiplexer 67. When the TAP controller enters the capture-DR state and pulses the CLOCKDR signal, shift element 68 receives the serial data input instead of sampling the state of the cell bypass signal 59. Thus, boundary-control cell 64 behaves the same for both the capture-DR and shift-DR states of the TAP controller. Consequently, the capture-DR state may be iteratively entered to receive a new sequence of control bits and then the shift-DR state skipped, or a combination of capture-DR and shift-DR states may be used to receive the new sequence of control bits. In either case, a control bit shifted into shift element 68 of boundary-control cell 64 is transferred to output element 70 during the update-DR state of the TAP controller.

Figure 8:
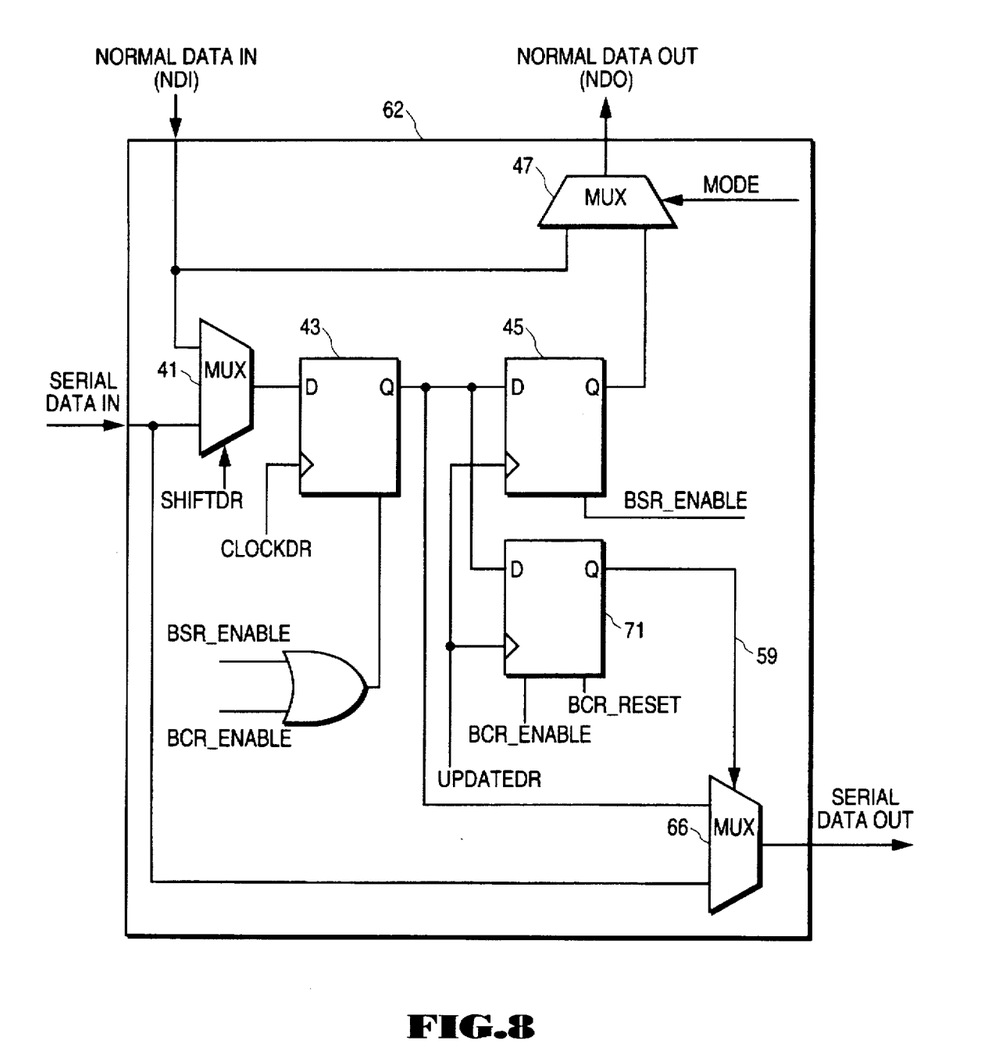
FIG. 8 is a circuit diagram of a boundary-scan cell according to an alternate embodiment of the present invention.

FIG. 8 is a circuit diagram of a boundary-scan cell 62 according to an alternate embodiment of the present invention. Boundary-scan cell 62 incorporates additional logic to permit it to operate as a boundary-scan cell and as a boundary-control cell. Specifically, output element 71 corresponds to output element 70 of FIG. 6 and is used to assert a boundary control signal 59 to multiplexer 66. Except for when a PATHDEF instruction has been shifted into the instruction register, the BCR_RESET and BCR_ENABLE signals are deasserted so that output element 71 and therefore multiplexer 66 are unaffected by data register control signals from the TAP controller. Thus, when the boundary-scan register has been selected (e.g., by an EXTEST or SAMPLE/PRELOAD instruction), and boundary-scan cell 62 has not previously been bypassed by multiplexer 66, data is shifted through shift element 43 in response to CLOCKDR pulses and stored in output element 45 in response to an UPDATEDR pulse as described above in reference to FIG. 6. However, when a PATHDEF instruction is loaded into the instruction register, the BCR_RESET input of each boundary-scan cell 62 in the boundary-scan register is pulsed to unbypass boundary-scan cell 62 from the boundary-scan path if previously bypassed. Also, the BCR_ENABLE is asserted and the BSR_ENABLE deasserted so that in the update-DR state of the TAP controller, the data value stored in shift element 43 is transferred to output element 71 instead of output element 45. Bypass control signal 59 is then set to either a bypass state or an unbypass state based on the data value transferred to output element 71. In the bypass state, bypass signal 59 causes multiplexer 66 to form a signal path between the serial data input and the serial data output so that the boundary-scan cell 62 is no longer in the boundary-scan path. In the unbypass state, bypass signal 59 causes multiplexer 66 to form a signal path between the output of shift element 43 and the serial data output.

It will be appreciated that once bypassed from the boundary-scan path, boundary-scan cell 62 cannot be unbypassed based on data shifted into shift element 43 because shift element 43 cannot receive new serial data from the serial data input. The BCR_RESET signal has therefore been provided to allow a bypassed boundary-scan cell 62 to be restored to the boundary-scan path. Other techniques may be used to restore boundary-scan cell 62 to the boundary-scan path without departing from the spirit and scope of the present invention.

It will also be appreciated that cell 62 can be considered to be both a boundary-scan cell and a boundary-control cell. The boundary-scan cell component of cell 62 includes multiplexer 41, shift element 43, output element 45, multiplexer 47 and multiplexer (bypass-circuit) 66. The boundary-control cell component of cell 62 includes shift element 43 and output element 71.

Figure 9:
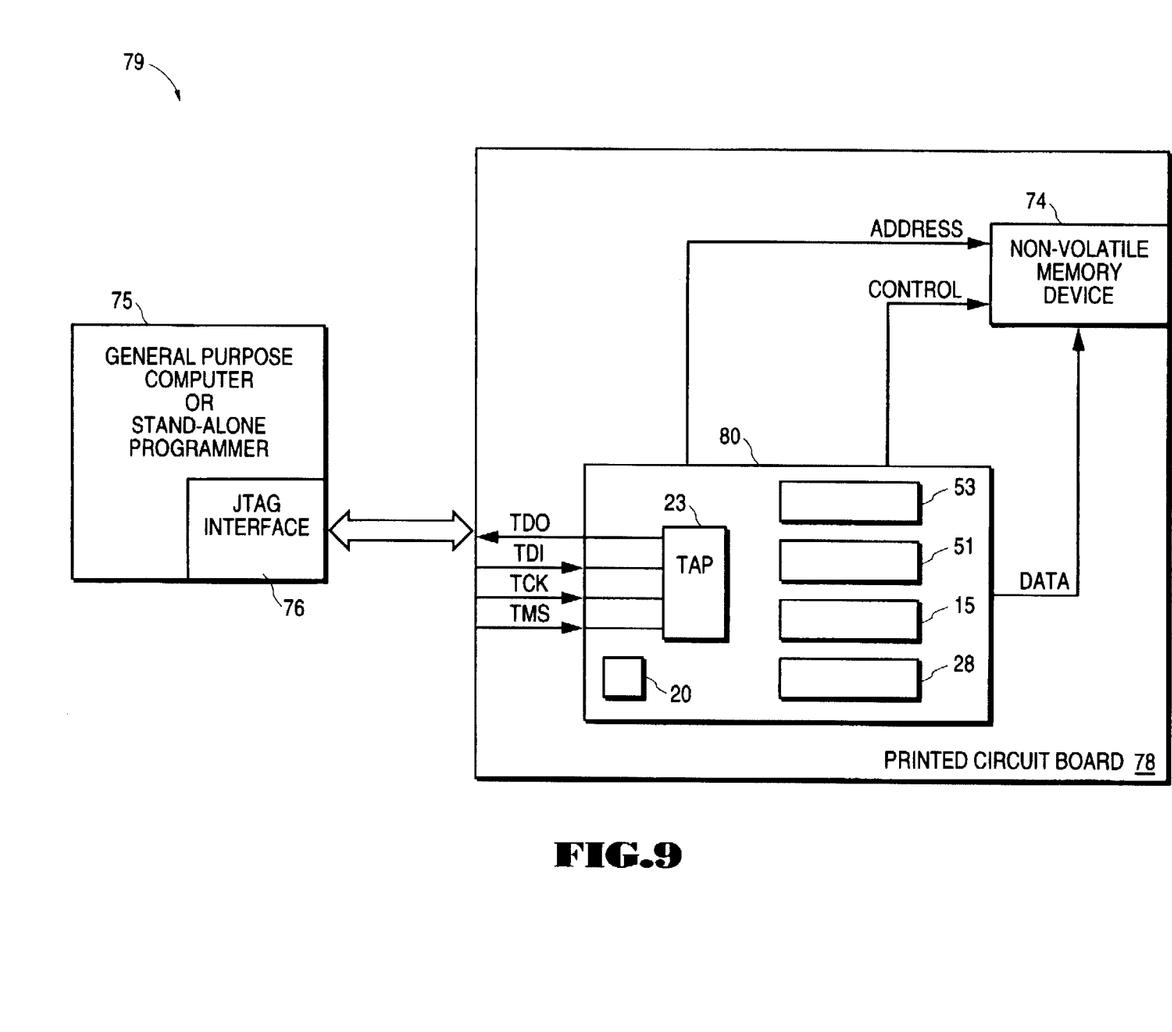
FIG. 9 is a block diagram illustrating on-board programming using an IC device having a boundary-scan architecture according to one embodiment of the present invention.

FIG. 9 is a block diagram illustrating on-board programming using an IC device 80 having a boundary-scan architecture according to one embodiment of the present invention. A general purpose computer (or stand alone programmer) 75 having a JTAG interface 76 is used to supply signals to the TDI, TMS and TCK inputs of IC device 80 and to receive signals output at the TDO of IC device 80. As shown in FIG. 9, IC device 80 includes TAP 23, TAP controller 20, instruction register 28, bypass register 15, boundary-scan register 51 and boundary-control register 53. As discussed above, boundary-control register 53 and boundary-scan register 51 may be designed to share certain circuit elements and serial data signal paths.

For the purpose of on-board programming, the boundary-scan register 51 of IC device 80 is used as an address, data and control signal source to program non-volatile memory device 77. Accordingly, IC device 80 is referred to as a source device and non-volatile memory device 77 is referred to as a target device.

Figure 10:
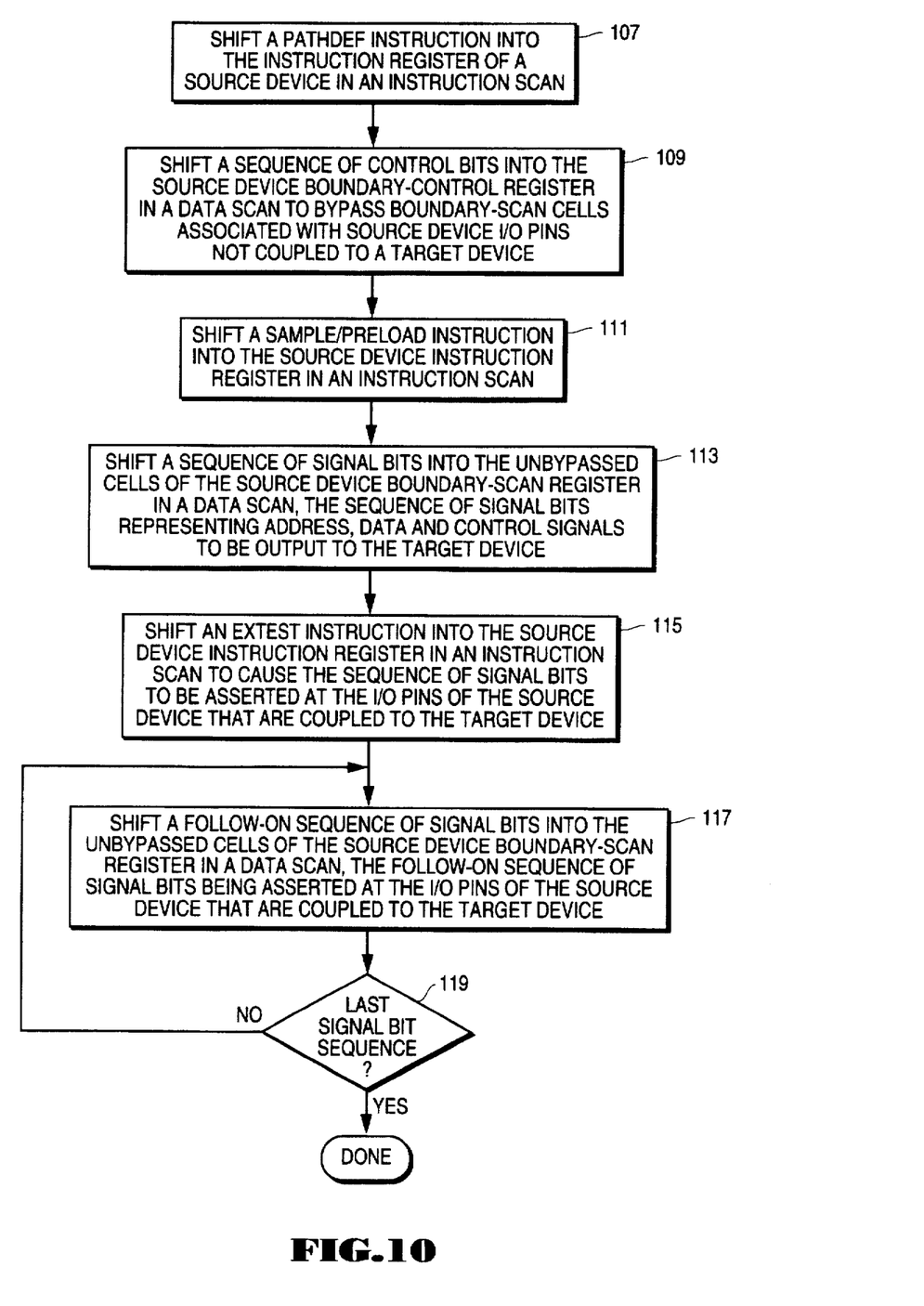
FIG. 10 is a flow diagram illustrating a sequence of operations for performing on-board programming according to one embodiment of the present invention.

FIG. 10 is a flow diagram illustrating a sequence of operations for performing on-board programming according to one embodiment of the present invention. At step 107, an instruction register scan is performed to load a PATHDEF instruction into the instruction register of a source device. As discussed above, the PATHDEF instruction is decoded to select the boundary-control register to form the serial data path between the TDI and TDO of the source device. Accordingly, at step 109, a sequence of control bits is shifted into the boundary-control register in a data register scan. As discussed above, the final state of a data register scan is an update-DR state which causes the control bits to be transferred to respective output elements within the boundary-control register. The output elements of the boundary-control register then activate or deactivate cell bypass signals based on the state of the control bits. As shown in step 109, the sequence of control bits is chosen to bypass I/O pins of the source device that are not coupled to the target device. In many cases bypassing unused I/O pins significantly reduces the number of boundary-scan cells in the boundary-scan path, resulting in substantially shorter programming time.

In step 111, another instruction register scan is performed to load a SAMPLE/PRELOAD instruction into the instruction register. Then in step 113, a data register scan is performed to shift a sequence of bits referred to as "signal bits" into the unbypassed boundary-scan cells of the boundary-scan register. The signal bits are transferred to output elements of respective boundary-scan cells in the update-DR state of the TAP-controller. Then, in step 115, yet another instruction register scan is performed to load an EXTEST instruction into the instruction register. The EXTEST instruction is decoded to enable each signal bit stored in an output element of an unbypassed boundary-scan cell in step 113 to be output at a respective output pin of the source device. This step represents the first set of program signals asserted to the target device by the source device. Then in step 117, another data register scan is performed to load a follow-on sequence of signal bits into the unbypassed boundary-scan cells. This time, because the EXTEST instruction is present in the source device instruction register, the signal bits are output to the target device as soon as they are transferred to the respective output elements of the unbypassed boundary-scan cells (i.e., during the update-DR state of the TAP controller). Step 117 is repeated until it is determined at step 119 that the last set of signals necessary to program the target device has been asserted.

It will be appreciated that many device programming operations require status information to be read in order to determine the next set of programming signals to be asserted. For example, if the target device is a flash memory device, it is usually necessary to read the ready/not-ready status of the target device before supplying the next data value to be programmed. This can be accomplished by capturing status information in source device input pins coupled to output pins of the target device during the capture-DR state of the TAP controller. This information can then be shifted out at the TDO and used by the programming device (e.g., element 75 of FIG. 9) to determine the next sequence of values to be shifted into the source device.

Figure 11:
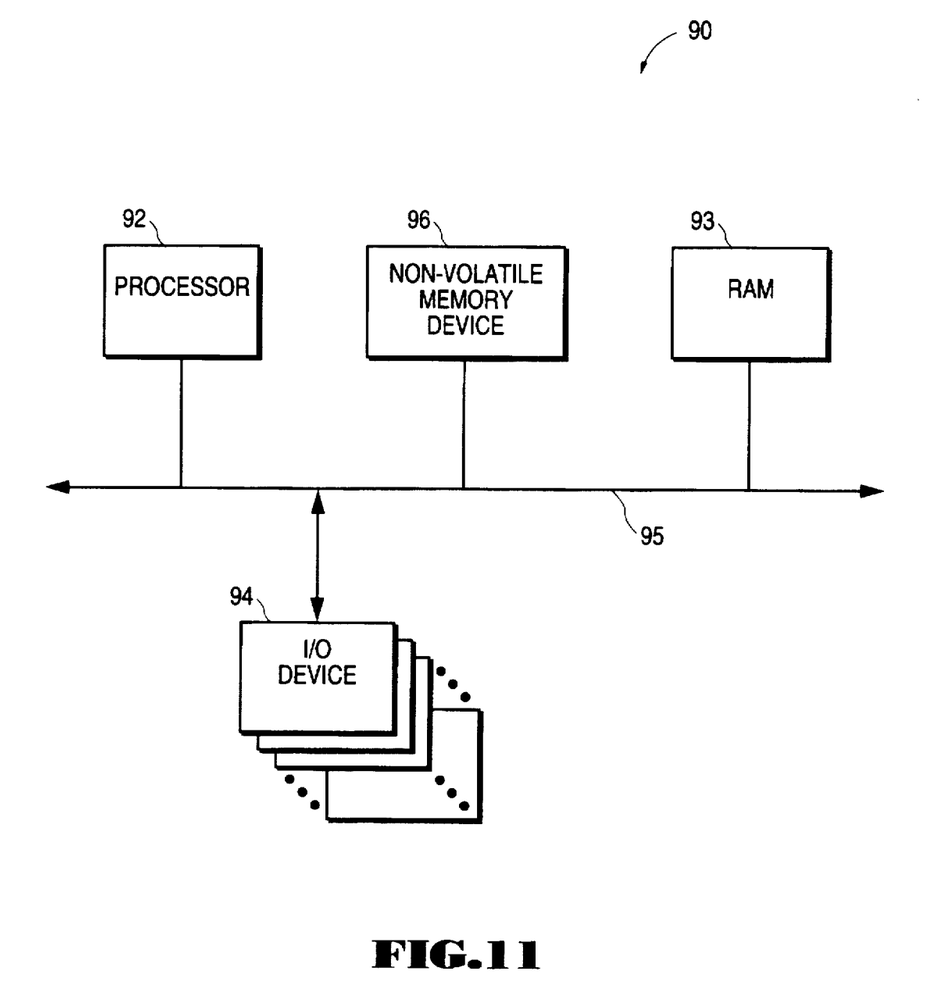
FIG. 11 is a block diagram of an apparatus including a processor having a boundary-scan architecture according to the present invention.

FIG. 11 is a block diagram of an apparatus 90 including a processor 92 random-access memory (RAM) 93, non-volatile memory 96 and I/O device 94 each coupled to bus 95. Processor 92 may be a microcontroller or microprocessor and includes a boundary-scan architecture according to the present invention. Apparatus 90 may be a computer system, electronic pager, camera, telephone, data recording instrument, or any other device in which processor-accessible non-volatile storage is required. In the case of a computer system, processor 92 may be a microprocessor and I/O device 94 may include a keyboard, mouse or other cursor control device, mass storage device, core memory, and display. In the case of a telephone, processor 92 may be a microcontroller and I/O device 94 may include a keypad, speaker, microphone, and signal generation and reception circuitry. In any case, non-volatile memory 96 includes a boot program executed by processor 92 at least at device power up to initialize apparatus 90. Bus 95 typically includes an address bus, data bus and control bus, each of which can be used to carry on-board programming signals generated by shifting sequences of bits into unbypassed boundary-scan cells in processor 92. Such on-board programming signals can be used to store the boot program in non-volatile memory 96. I/O device 94 is depicted as a plurality of devices in FIG. 11 to indicate that the number and type of I/O devices connected to bus 95 may differ from application to application.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for dynamically configuring the number of boundary-scan cells in a boundary-scan path, said method comprising the steps of:

asserting a plurality of control signals to a plurality of boundary-scan cells in a boundary-scan path, each control signal of the plurality of control signals being in a first state or a second state; and bypassing in the boundary-scan path each one of the plurality of boundary-scan cells for which a respective one of the plurality of control signals is in the first state.

2. The method of claim 1 further comprising the step of restoring to the boundary scan path each one of the plurality of boundary-scan cells that had been previously bypassed and for which a respective one of the plurality of control signals is in the second state.

3. The method of claim 1 wherein said step of bypassing comprises the step of forming a signal path between a serial data input and a serial data output of each one of the plurality of boundary-scan cells for which the respective one of the plurality of control signals is in the first state.

4. The method of claim 1 wherein said step of asserting a plurality of control signals to a plurality of boundary-scan cells comprises the steps of:

shifting a sequence of control bits into a plurality of storage elements; and outputting the plurality of signals from the plurality of storage elements, each one of the plurality of signals having the first state or the second state based on a respective control bit of the sequence of control bits.

5. A method for dynamically configuring the number of boundary-scan cells in a boundary-scan path, said method comprising the steps of:

receiving a control bit in a storage element associated with a boundary-scan cell in the boundary-scan path; and forming a signal path between a serial data input of the boundary-scan cell and a serial data output of the boundary-scan cell to bypass the boundary-scan cell in the boundary-scan path if the bit is in a first state.

6. The method of claim 5 wherein said step of forming a signal path comprises the steps of:

the storage element asserting a bypass signal to a bypass circuit in the boundary-scan cell if the control bit is in the first state; and the bypass circuit forming the signal path between the serial data input and the serial data output in response to the bypass signal.

7. A method for performing on-board device programming, said method comprising the steps of:

bypassing cells in a boundary-scan path of an integrated circuit that correspond to input/output (I/O) pins not coupled to I/O pins of a target device;

shifting bits into unbypassed cells in the boundary-scan path of the integrated circuit that correspond to I/O pins coupled to I/O pins of the target device; and asserting signals at I/O pins coupled to the target device to program the target device based on the bits shifted into the unbypassed cells.

8. The method of claim 7 wherein said step of bypassing cells in a boundary-scan path comprises the step of bypassing cells in a boundary-scan register of a JTAG-compliant integrated circuit.

9. The method of claim 7 wherein said step of bypassing cells in a boundary-scan path includes the steps of:

asserting a plurality of control signals to the plurality of boundary-scan cells in a boundary-scan path, each control signal of the plurality of control signals having a first state or a second state; and bypassing in the boundary scan path each one of the plurality of boundary-scan cells for which a respective one of the plurality of control signals is in the first state.

10. An integrated circuit comprising:

a boundary-scan register including a plurality of boundary-scan cells; and a plurality of bypass circuits each including a bypass enable input, each one of said plurality of bypass circuits forming a signal path between a serial data input and a serial data output of a respective boundary-scan cell of said plurality of boundary-scan cells in response to receiving an active signal at its bypass enable input.

11. The integrated circuit of claim 10 further comprising a plurality of control elements each being in a first state or a second state, each one of said plurality of control elements outputting an active signal to the bypass enable input of a respective one of said plurality of bypass circuits if in the first state.

12. The integrated circuit of claim 10, wherein said integrated circuit is JTAG-compliant.

13. A integrated circuit comprising:
- a boundary-scan register including a plurality of boundary-scan cells, each of the plurality of boundary-scan cells including a bypass circuit coupled between a serial data input and a serial data output; and
- a boundary-control register including a plurality of boundary-control cells, each of said plurality of boundary control cells asserting a control signal being in either a first or second state to the bypass circuit of a respective one of the plurality of boundary-scan cells, the bypass circuit enabling a signal path between the serial data input and the serial data output of the respective one of the plurality of boundary-scan cells if the control signal is in the first state.

14. The integrated circuit of claim 13 wherein the bypass circuit disables the signal path between the serial data input and the serial data output if the control signal is in the second state.

15. An integrated circuit comprising:
- means for asserting a plurality of control signals to a plurality of boundary-scan cells in a boundary-scan path of said integrated circuit, each control signal of the plurality of control signals being in a first state or a second state; and
- means for bypassing in the boundary-scan path each one of the plurality of boundary-scan cells for which a respective one of the plurality of control signals is in the first state.

16. The integrated circuit of claim 15 further comprising means for restoring to the boundary scan path each one of the plurality of boundary-scan cells that had been previously bypassed and for which a respective one of the plurality of control signals is in the second state.

17. The integrated circuit of claim 15 wherein said means for bypassing comprises means for forming a signal path between a serial data input and a serial data output of each one of the plurality of boundary-scan cells for which the respective one of the plurality of control signals is in the first state.

18. The integrated circuit of claim 15 wherein said means for asserting a plurality of control signals to a plurality of boundary-scan cells comprises:
- means for shifting a sequence of control bits into a plurality of storage elements; and
- means for outputting the plurality of signals from the plurality of storage elements, each one of the plurality of signals having the first state or the second state based on a respective control bit of the sequence of control bits.

19. An apparatus comprising:
- a bus;
- a memory device coupled to said bus; and
- a processor coupled to said bus, said processor including
  - a boundary-scan register including a plurality of boundary-scan cells; and
  - a plurality of bypass circuits each including a bypass enable input, each one of said plurality of bypass circuits forming a signal path between a serial data input and a serial data output of a respective boundary-scan cell of said plurality of boundary-scan cells in response to receiving an active signal at its bypass enable input.

20. The apparatus of claim 19 wherein said processor further includes a plurality of control elements each being in a first state or a second state, each one of said plurality of control elements outputting an active signal to the bypass enable input of a respective one of said plurality of bypass circuits if in the first state.

\* \* \* \* \*